(12) United States Patent
Kim

(10) Patent No.: US 7,349,222 B2
(45) Date of Patent: Mar. 25, 2008

(54) PLASMA DISPLAY APPARATUS

(75) Inventor: Myoung-Kon Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/385,874

(22) Filed: Mar. 22, 2006

(65) Prior Publication Data
US 2006/0223347 A1 Oct. 5, 2006

(30) Foreign Application Priority Data
Apr. 2, 2005 (KR) .................. 10-2005-0027823

(51) Int. Cl.
H05K 7/02 (2006.01)

(52) U.S. Cl. ...................................... 361/758

(58) Field of Classification Search .................. 439/92, 439/95; 361/742, 752, 753, 758, 770, 804
See application file for complete search history.

(56) References Cited

U.S. PATENT DOCUMENTS 4,760,495 A * 7/1988 Till .............................. 361/804
5,671,124 A * 9/1997 Ho ............................... 361/758
5,978,232 A * 11/1999 Jo ................................ 361/796
6,333,855 B2 * 12/2001 Prabaonnaud et al. ...... 361/758
6,347,044 B1 * 2/2002 Won et al. ................... 361/807
6,490,165 B2 * 12/2002 Mizusaki ..................... 361/752
7,052,291 B2 * 5/2006 Barina et al. ................. 439/92

* cited by examiner

Primary Examiner—Thanh-Tam Le
(74) Attorney, Agent, or Firm—Lee & Morse, P.C.

(57) ABSTRACT

A plasma display panel, a chassis coupled to the plasma display panel, a substrate having a hole therethrough and having circuits to drive the plasma display panel, the substrate spaced apart from the chassis, a grounding boss extending from the chassis, the grounding boss having a diameter smaller than the hole and passing through the hole without contacting the substrate, a grounding bracket fixed on the grounding boss, spaced a predetermined distance from the substrate, and electrically connected to the chassis through the grounding boss, and a spacer inserted into the hole, disposed between the grounding boss and the grounding bracket and determining a height of the grounding bracket.

12 Claims, 7 Drawing Sheets

PLASMA DISPLAY APPARATUS

BACKGROUND OF THE INVENTION

1. Field of the Invention

The present invention relates to a plasma display apparatus. More particularly, the present invention relates to a plasma display apparatus that provides enhanced control over grounding circuits and includes a spacer to control grounding and positioning of a grounding bracket.

2. Description of the Related Art

FIG. 1 illustrates an exploded perspective view of a plasma display apparatus. Referring to FIG. 1, a plasma display apparatus may include a front case 1 having a window, a rear case 2 that defines an inner space in combination with the front case 1, a plasma display panel 3 disposed in the inner space, a chassis 5 coupled to the plasma display panel 3, and a substrate 4, e.g., a printed circuit board, which has circuits that drive the plasma display panel 3.

FIG. 2 illustrates a perspective view of a conventional grounding and positioning arrangement of the substrate, a grounding boss and a grounding bracket mounted on the chassis of the plasma display apparatus. Referring to FIG. 2, the substrate 4 may be spaced a predetermined distance away from the chassis 5 by fixed legs 6, and may have a hole 7 that passes through the substrate 4 near an edge of the substrate 4. A grounding boss 8 and a grounding bracket 9 may be grounded to the chassis 5, in order to prevent electromagnetic interference (EMI) during operation of the plasma display panel 3 and to provide circuit stabilization. The grounding boss 8 and the grounding bracket 9 may be formed of conductive materials, e.g., metals.

FIG. 3 illustrates a cross-sectional view of the conventional grounding and positioning arrangement of FIG. 2. Referring to FIG. 3, the substrate 4 is typically mounted between the chassis 5 and the grounding bracket 9 with the grounding boss 8 passing through the substrate 4 without contacting the substrate 4. That is, the grounding boss 8 has a smaller diameter than the hole 7 in the substrate 4, so that the grounding boss 8 can pass through the hole 7 with some marginal space, while extending to a predetermined height from the chassis 5. Thus, when the grounding bracket 9 is fixed to the grounding boss 8, e.g., using a screw 10, it is separated from the substrate 4 by predetermined distance. At the same time, the grounding bracket 9 is electrically connected to the chassis 5 through the grounding boss 8, in order to reduce EMI and provide circuit stabilization.

The grounding boss 8 and the grounding bracket 9 are typically formed of a conductive material. Accordingly, the chassis 5, the grounding boss 8 and the grounding bracket 9 are grounded together due to being in electrical contact with each other. However, in this arrangement they are not grounded to the substrate 4.

The grounding and positioning arrangement of the substrate 4, the grounding boss 8 and the grounding bracket 9 illustrated in FIGS. 2 and 3 is not well suited to use in multiple models of plasma display apparatuses. That is, where a manufacturer desires to produce multiple models of plasma display apparatuses, it is desirable to have component parts of the various models shared in common, in order to lessen the number of component designs, improve interchangeability, reduce inventory, etc.

However, in the conventional arrangement, the chassis 5 and other parts may not be suited to common use amongst the various models of plasma display apparatuses. For example, the grounding boss 8 that determines the height of the grounding bracket 9 typically needs to have different lengths according to the specifications and model of the chassis 5. Moreover, the substrate 4 and the grounding bracket 9 may vary according to the manufacturer of these components. Also, when the design of the chassis 5 is changed, parts of the substrate 4 are changed, or other parts are added, the distance between the chassis and the grounding bracket 9 cannot be easily adjusted. Accordingly, the conventional grounding and positioning arrangement limits the manufacturer's ability to change designs or change parts.

SUMMARY OF THE INVENTION

The present invention is therefore directed to a plasma display apparatus, which substantially overcomes one or more of the problems due to the limitations and disadvantages of the related art.

It is therefore a feature of an embodiment of the present invention to provide a plasma display apparatus having a grounding and spacing arrangement wherein a spacer is disposed on a grounding boss.

It is therefore another feature of an embodiment of the present invention to provide a plasma display apparatus having a spacer disposed on a grounding boss, wherein the spacer may be varied according to the particular application.

It is therefore a further feature of an embodiment of the present invention to provide a plasma display apparatus having a spacer disposed on a grounding boss, wherein the height of the spacer may vary, and the spacer may have a conductive portion or may be essentially non-conductive.

At least one of the above and other features and advantages of the present invention may be realized by providing a plasma display apparatus, including a plasma display panel, a chassis coupled to the plasma display panel, a substrate having a hole therethrough and having circuits to drive the plasma display panel, the substrate spaced apart from the chassis, a grounding boss extending from the chassis, the grounding boss having a diameter smaller than the hole and passing through the hole without contacting the substrate, a grounding bracket fixed on the grounding boss, spaced a predetermined distance from the substrate, and electrically connected to the chassis through the grounding boss, and a spacer inserted into the hole, disposed between the grounding boss and the grounding bracket and determining a height of the grounding bracket.

The spacer may include an upper unit having a through-hole part through which a screw can pass, a main body unit having a tubular shape configured to surround an upper part of the grounding boss, and an arm unit having a tapered end that is thinner than the main body unit and configured to elastically bend when the arm unit is inserted into the hole. The upper unit, the main body unit and the arm unit of the spacer may be formed as one body, and the spacer may be at least partially composed of a nonconductive material. The through hole part of the upper unit may be formed of a conductive metal, and the through hole part may be electrically connected to the grounding boss.

The spacer may include arms having grooves therein, and the grooves may receive the substrate. An upper surface of the spacer may be disposed against the grounding bracket, and the predetermined distance may be determined by a distance between the upper surface of the spacer and the grooves. The spacer may be in direct contact with the grounding boss and the arms may not be conductive, such that the substrate is electrically insulated from the grounding boss by the spacer. The grounding boss may extend a first distance from the chassis, the substrate may be spaced apart from the chassis by a second distance, the first distance may be greater than the second distance, and the first distance may be less than the height.

At least one of the above and other features and advantages of the present invention may also be realized by providing a spacer including a body and a plurality of grooved arms, wherein the grooved arms are spaced apart from each other so as to receive a grounding boss between the grooved arms, a cavity for receiving a fastener is defined within the spacer, the cavity extending in a length direction of the spacer and having a width less than a space between the grooved arms, so as to prevent the grounding boss from being received in the cavity, and the grooved arms have grooves on outer surfaces thereof.

The spacer may further include a conductive member disposed in the body and surrounding the cavity.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
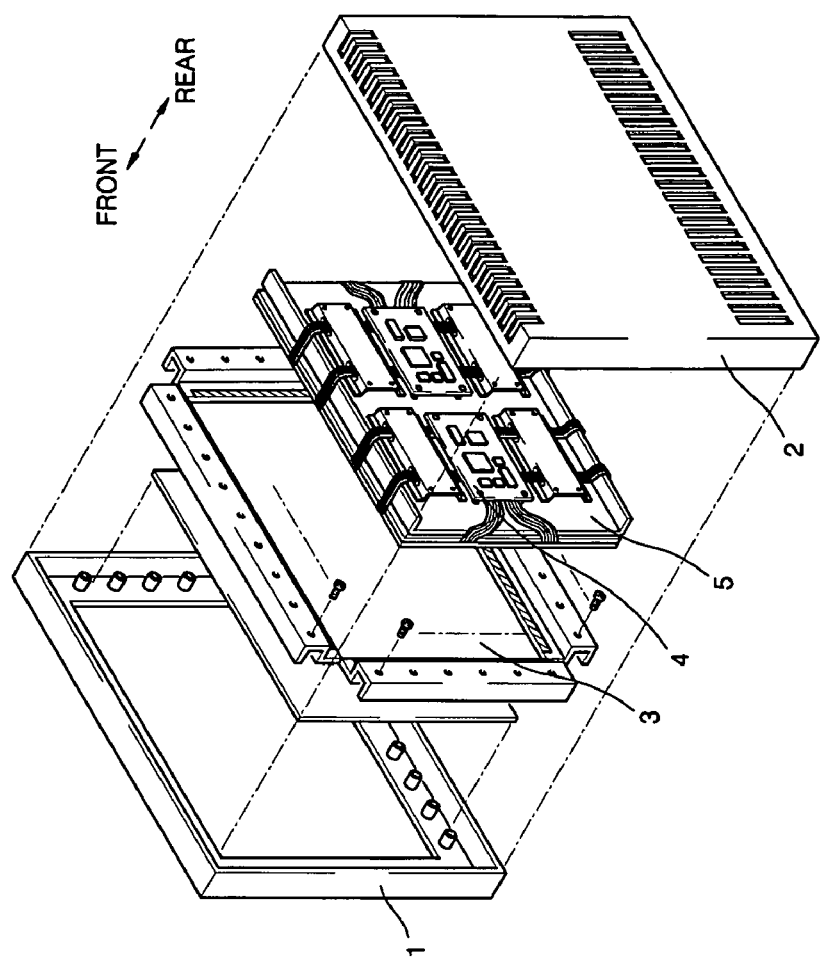
FIG. 1 illustrates an exploded perspective view of a plasma display apparatus.
Figure 2:
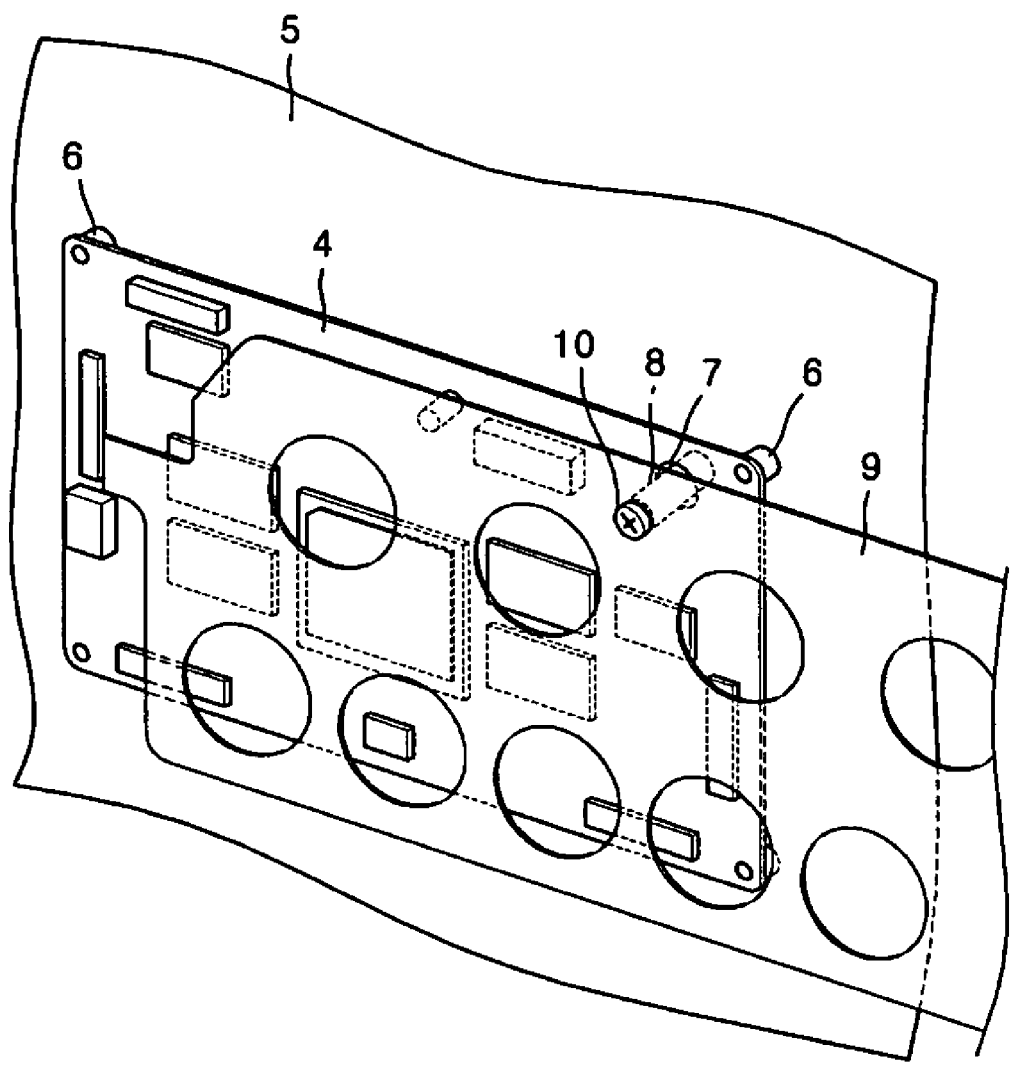
FIG. 2 illustrates a perspective view of a conventional grounding and positioning arrangement of a substrate, a grounding boss and a grounding bracket mounted on a chassis of a plasma display apparatus.
Figure 3:
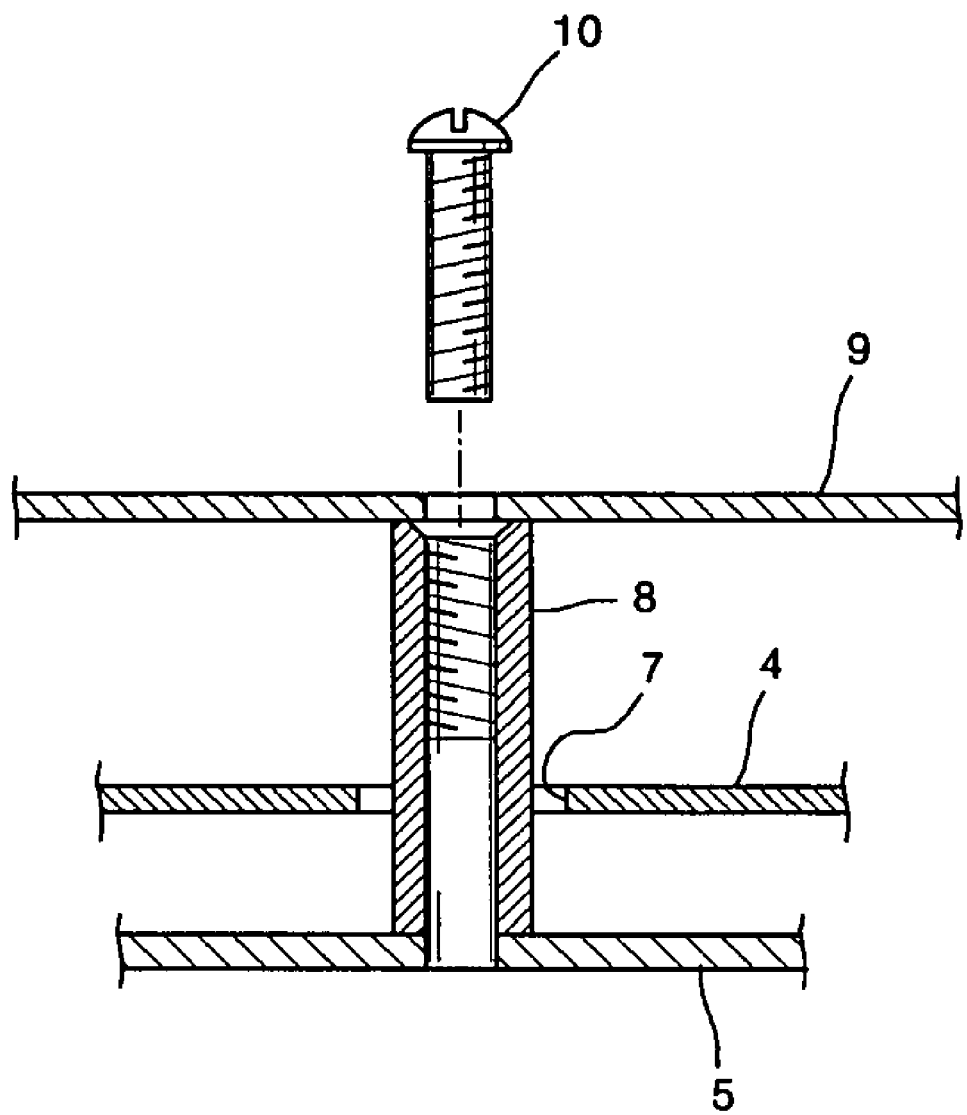
FIG. 3 illustrates a cross-sectional view of the conventional grounding and positioning arrangement of FIG. 2.

Korean Patent Application No. 10-2005-0027823, filed on Apr. 2, 2005, in the Korean Intellectual Property Office, and entitled: "Plasma Display Apparatus," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A plasma display apparatus according to the present invention is configurable to ground and position various parts and modules through the use of a spacer. For example, the spacer may be used to compensate for varying lengths of grounding bosses of different types of chassis, various substrates and grounding brackets from different manufacturers, etc., and, accordingly, may reduce or eliminate design limitations and the need for multiple parts. The spacer may allow easy adjustment of the position of a grounding bracket when the design of a chassis is changed, parts of the substrate are changed, or other parts are added, while maintaining a grounding function.

Figure 4:
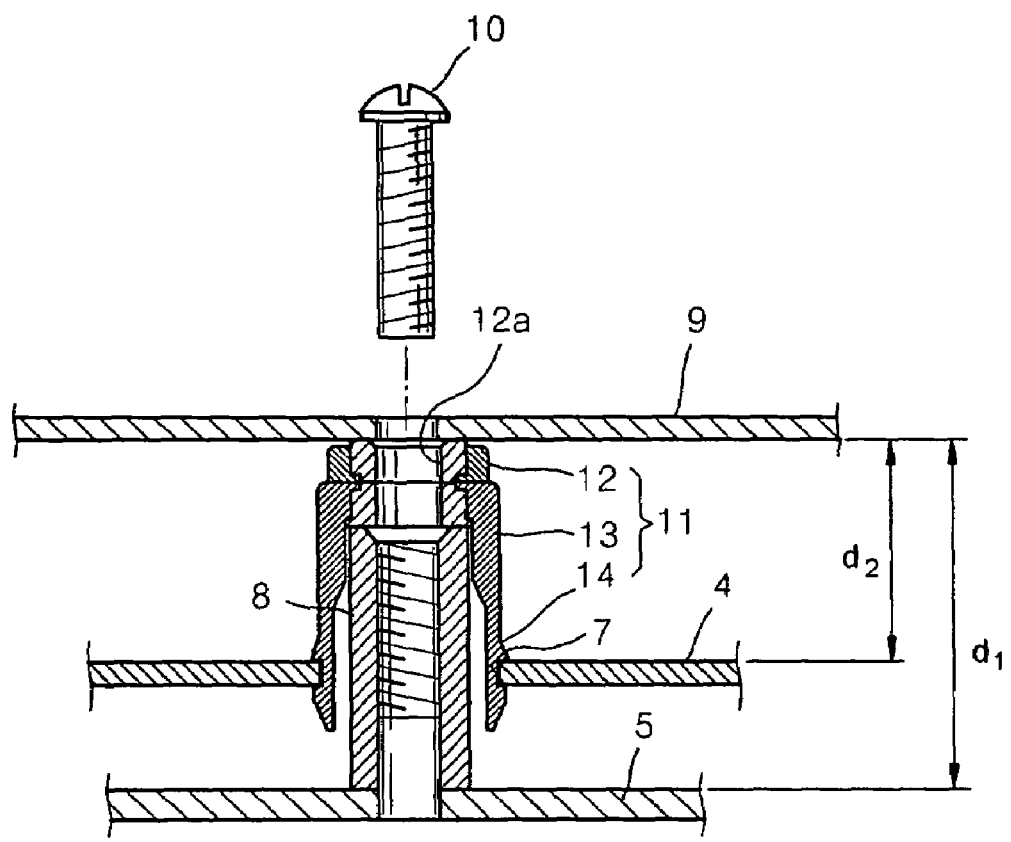
FIG. 4 illustrates a cross-sectional view of a grounding and positioning arrangement of a substrate, a grounding boss, a grounding bracket and a spacer according to an embodiment of the present invention.

FIG. 4 illustrates a cross-sectional view of a grounding and positioning arrangement of a substrate, a grounding boss, a grounding bracket and a spacer according to an embodiment of the present invention. Referring to FIGS. 1 and 4, a plasma display apparatus according to an embodiment of the present invention may include a front case 1, a rear case 2, a plasma display panel 3, substrate 4 and a chassis 5, as described above. The plasma display apparatus may also include the substrate 4 spaced apart from the chassis 5 by the fixed legs 6 and having the hole 7 through the substrate 4 near an edge.

Referring to FIG. 4, the grounding bracket 9, which may be formed of a conductive material, may be fixed on the grounding boss 8, separated from the chassis 5 by a predetermined distance $d_1$, and separated from the substrate 4 by a predetermined distance $d_2$. The predetermined distances $d_1$, $d_2$ may be determined, at least in part, by a spacer 11 disposed on the grounding boss 8 beneath the grounding bracket 9.

The grounding bracket 9 may be electrically connected to the chassis 5 through the grounding boss 8 to reduce electromagnetic interference (EMI) and provide circuit stabilization. According to this embodiment of the present invention, the spacer 11 includes a conductive member to electrically connect the grounding bracket 9 to the chassis 5, which will be discussed in greater detail below.

The spacer 11 may be inserted into the hole 7 of the substrate 4. The spacer 11 may be configured to reversibly and elastically deform, i.e., bend, when forcibly inserted into the hole 7, so that it remains in place. The spacer 11 may extend between the grounding boss 8 and the grounding bracket 9, so that the distance $d_2$ between the grounding bracket 9 and the substrate 4, or the distance $d_1$ between the grounding bracket 9 and chassis 5, can be determined, at least in part, by the dimensions of the spacer 11. The distance $d_2$ may also be determined in part by the length of an arm unit 14 of the spacer 11, as described below.

For example, a taller or thicker spacer 11 may be used to increase the height of the grounding bracket 9 off of the chassis 5 or the substrate 4. Alternatively, the height may be decreased by using a shorter spacer 11. Of course, the height of the grounding boss 8 itself may also be changed to affect the relative spacings of the grounding bracket 9, the substrate 4 and the chassis 5. However, providing a spacer 11 having a different thickness may be cheaper and more expedient than modifying the dimensions of the grounding boss 8. The spacer 11 may be disposed on the grounding boss 8 and fixed in place by being inserted into the hole 7.

Figure 5:
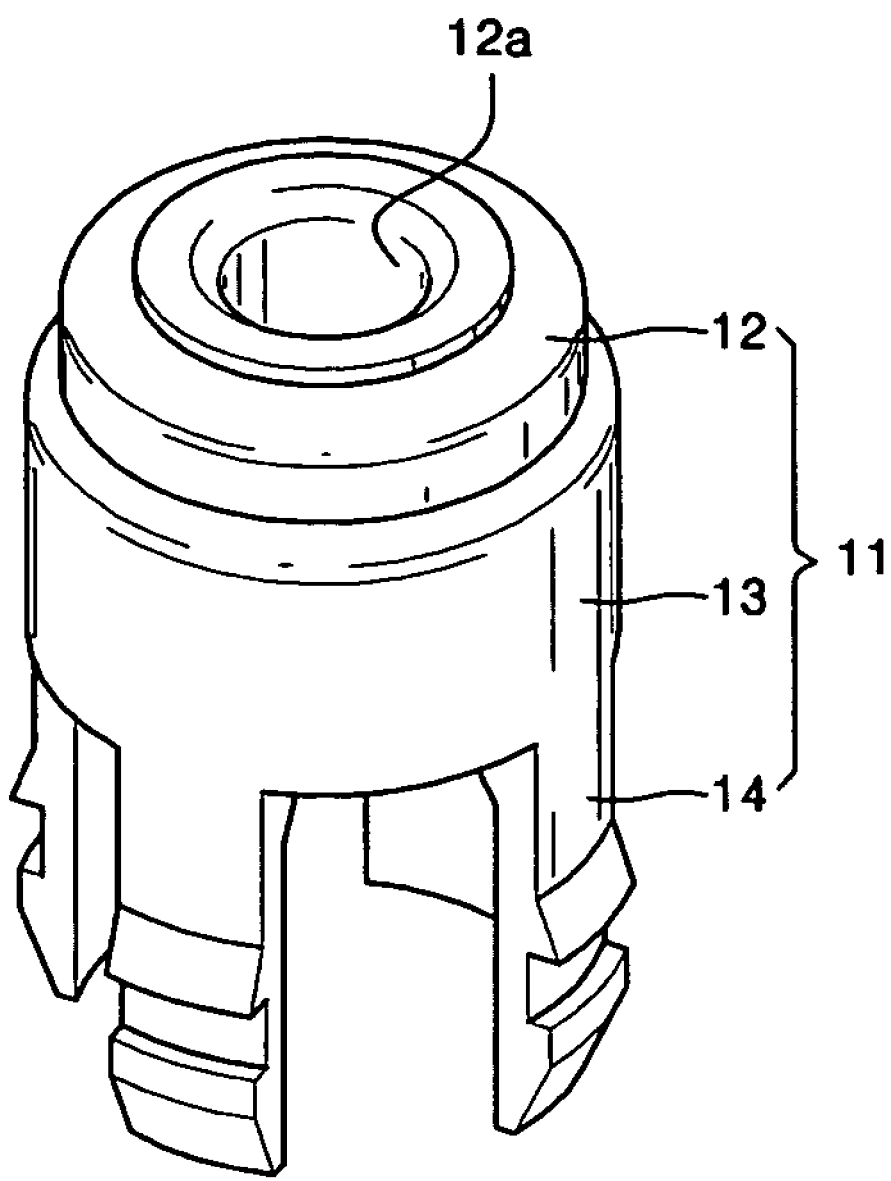
FIG. 5 illustrates a perspective view of the spacer of FIG. 4.

FIG. 5 illustrates a perspective view of the spacer of FIG. 4. Referring to FIGS. 4 and 5, the spacer 11 may include an upper unit 12 having a through-hole part 12a through which the screw 10 can pass. The spacer 11 may also have a main body unit 13, which may be tubular, that surrounds the upper part of the grounding boss 8, and the arm unit 14.

The arm unit 14 may have a tapered or pointed cross-section resembling an open arrow head, so as to ease the insertion of the spacer 11 into the hole 7. The arm unit 14 may be thinner than the main body unit 13, so that the arm unit 14 can elastically bend when it is forcibly inserted into the hole 7. The arms of the arm unit 14 may include a groove that corresponds to the substrate 4, so that the arm unit 14 can snap in place when inserted in the substrate 4. The length of the arm unit 14 and/or the positioning of the groove on the arm unit 14 may be used to determine, at least in part, the distance $d_2$ between the grounding bracket 9 and the substrate 4. The depth of the groove may correspond to the diameter of the hole 7, so that, after installation of the spacer 11 in the substrate 4, the arms of the arm unit 14 can relax in order to provide clearance for the grounding boss 8.

Figure 6:
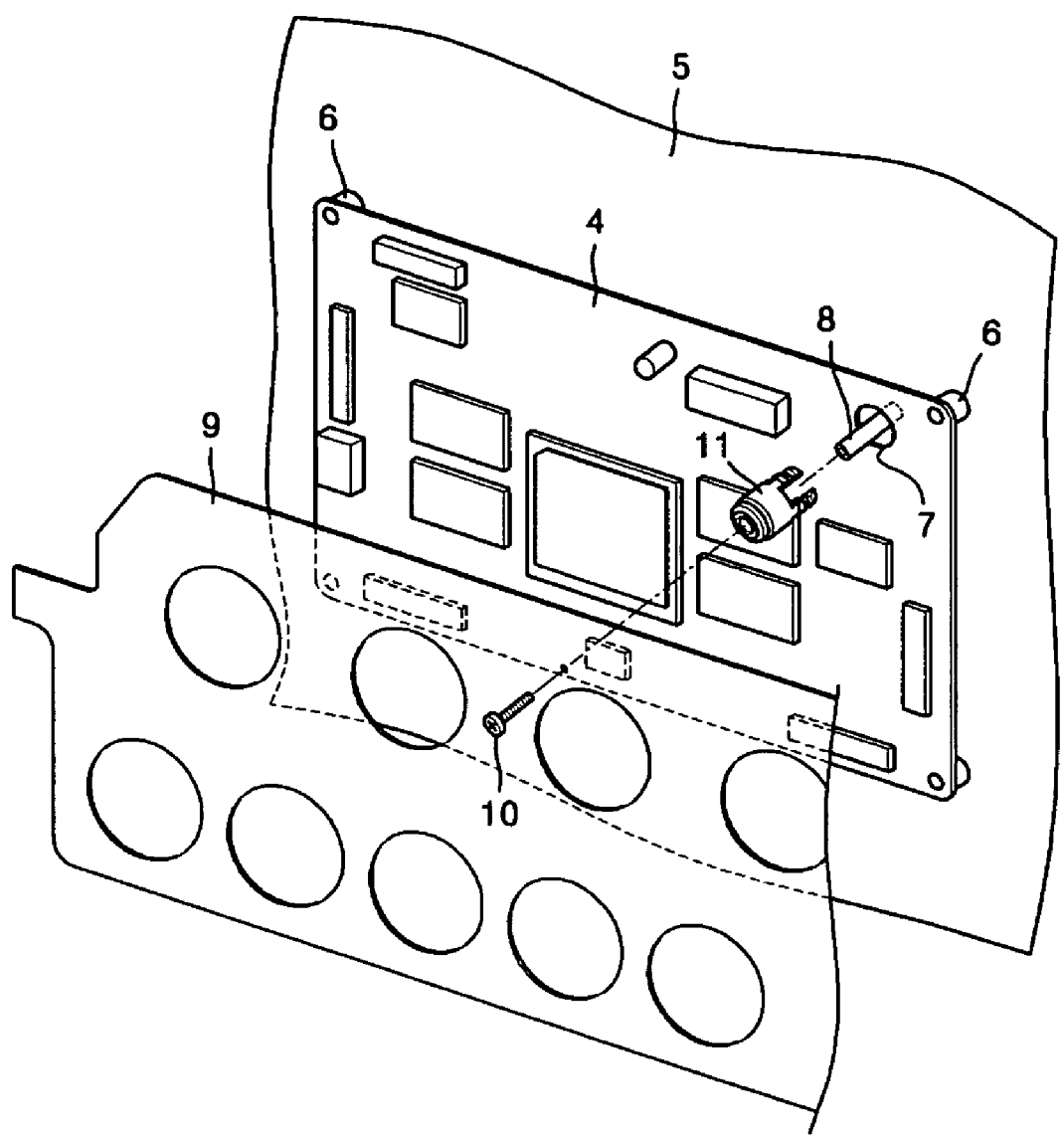
FIG. 6 illustrates an exploded perspective view of the substrate, the grounding boss, the grounding bracket, and the spacer of FIG. 4.

FIG. 6 illustrates an exploded perspective view of the substrate, the grounding boss, the grounding bracket, and the spacer of FIG. 4. Referring to FIG. 6, the grounding boss 8 and the substrate 4 may be assembled to the chassis 5. The arm unit 14 of the spacer 11 may be inserted into the hole 7 of the substrate 4 so that the spacer 11 is fixed to the substrate 4 over the grounding boss 8. The grounding bracket 9 may be coupled to the chassis 5 by the screw 10, which passes through the grounding bracket 9 and the spacer 11, thereby capturing the grounding bracket 9 and the spacer 11 and fixing the substrate 4 in place.

The chassis 5, the grounding boss 8, the spacer 11, the grounding bracket 9 and the screw 10 may be electrically connected, and, thus, they may be commonly grounded. The through-hole part 12a of the upper unit 12 may be formed of a conductive material, e.g., a metal, so that the spacer 11 and the grounding boss 8 can be electrically connected. The upper unit 12, the main body unit 13, and the arm unit 14 of the spacer 11 may be monolithically formed as one body, and may be composed of a non-conductive material, e.g., a non-conductive plastic, so that the spacer 11 and the substrate 4 are not electrically connected. If a different circuit substrate (not shown) must be electrically coupled and grounded to the grounding bracket 9, the ground may be separately provided to the circuit substrate through a boss (not shown) that couples the circuit substrate to the grounding bracket 9.

Figure 7:
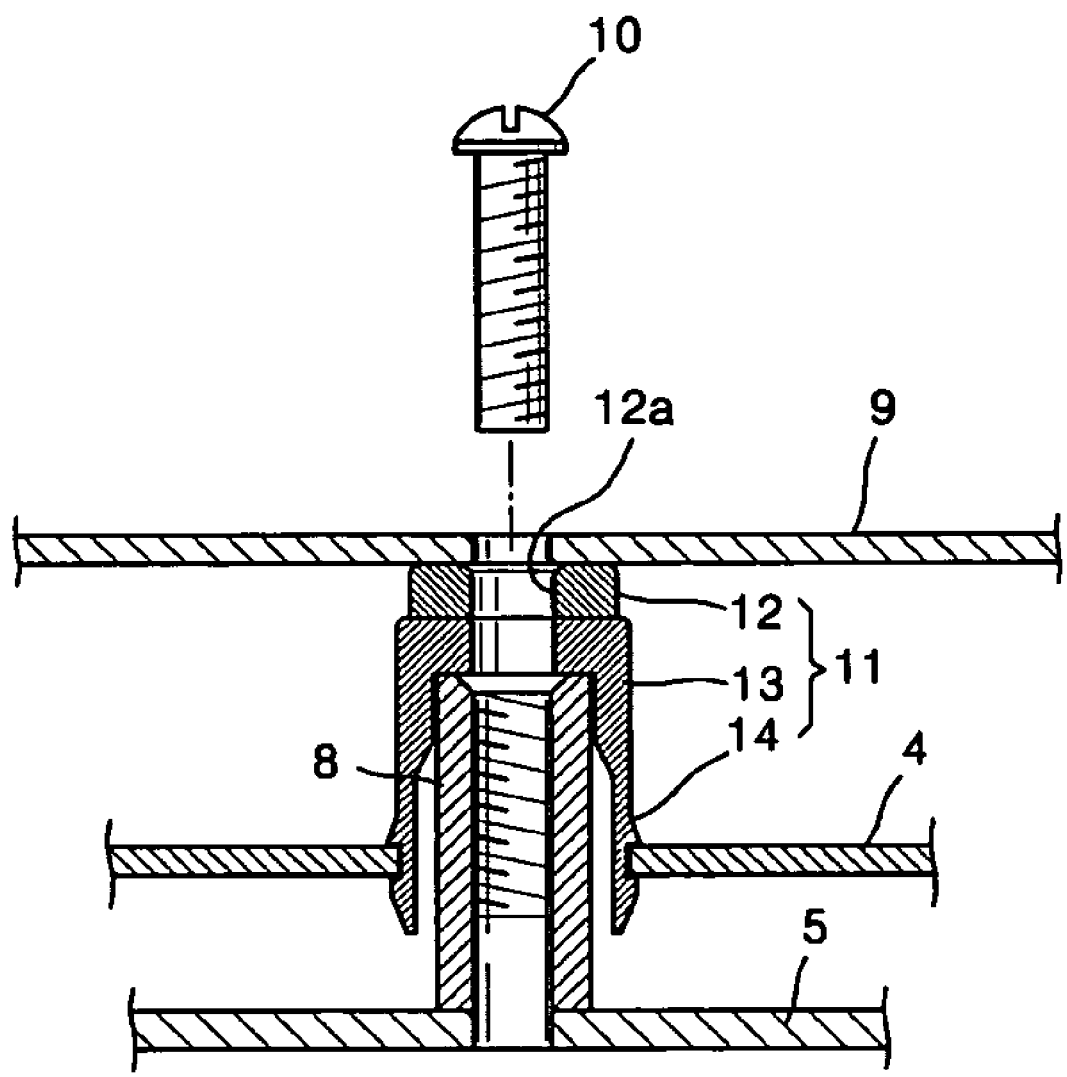
FIG. 7 illustrates a cross-sectional view of a grounding and positioning arrangement of a substrate, a grounding boss, a grounding bracket and a spacer according to another embodiment of the present invention.

FIG. 7 illustrates a cross-sectional view of a grounding and positioning arrangement of a substrate, a grounding boss, a grounding bracket and a spacer according to another embodiment of the present invention. Referring to FIG. 7, the whole spacer 11 may be formed as one body and may be composed of a non-conductive material. That is, according to this embodiment of the present invention, the through-hole part 12a of the upper unit 12 is not formed of the conductive material. In this case, the electrical connection for the ground may be provided between the grounding boss 8 and the grounding bracket 9 by the screw 10.

Exemplary embodiments of the present invention have been disclosed herein, and although specific terms are employed, they are used and are to be interpreted in a generic and descriptive sense only and not for purpose of limitation. For example, the shape, size and other specifications of the spacer 11 may be modified various ways, in order to provide for the common use of parts and modules such as the substrate 4, the chassis 5 and the grounding bracket 9. In particular, the shape and the design of the upper unit 12, the main body unit 13 and the arm unit 14 of the spacer 11 are not limited to those shown in the drawings. Accordingly, it will be understood by those of ordinary skill in the art that various changes in form and details may be made without departing from the spirit and scope of the present invention as set forth in the following claims.

What is claimed is:

1. A plasma display apparatus, comprising:
   a plasma display panel;
   a chassis coupled to the plasma display panel;
   a substrate having a hole therethrough and having circuits to drive the plasma display panel, the substrate spaced apart from the chassis;
   a grounding boss extending from the chassis, the grounding boss having a diameter smaller than the hole and passing through the hole without contacting the substrate;
   a grounding bracket fixed on the grounding boss, spaced a predetermined distance from the substrate, and electrically connected to the chassis through the grounding boss; and
   a spacer inserted into the hole, wherein:
      the spacer is disposed between the grounding boss and the grounding bracket,
      the spacer separates the grounding boss from the grounding bracket, and
      the spacer determines a height of the grounding bracket from the chassis.

2. The plasma display apparatus as claimed in claim 1, wherein the spacer comprises:
   an upper unit having a through-bole part through which a screw can pass;
   a main body unit having a tubular shape configured to surround an upper part of the grounding boss; and
   an arm unit having a tapered end that is thinner than the main body unit and configured to elastically bend when the arm unit is inserted into the hole.

3. The plasma display apparatus as claimed in claim 2, wherein the upper unit, the main body unit and the arm unit of the spacer are formed as one body, and
   the spacer is at least partially composed of a nonconductive material.

4. The plasma display apparatus as claimed in claim 3, wherein the through-hole part of the upper unit is formed of a material including a conductive metal, and
   the through-hole part is electrically connected to the grounding boss.

5. The plasma display apparatus as claimed in claim 3, wherein a through-hole part of the upper unit is formed of a nonconductive material such that the through-hole part is not electrically connected to the grounding boss.

6. The plasma display apparatus as claimed in claim 1, wherein the spacer includes arms having grooves therein, and the grooves receive the substrate.

7. The plasma display apparatus as claimed in claim 6, wherein an upper surface of the spacer is disposed against the grounding bracket, and
   the predetermined distance is determined by a distance between the upper surface of the spacer and the grooves.

8. The plasma display apparatus as claimed in claim 6, wherein the spacer is in direct contact with the grounding boss and the substrate, and
   the arms are not conductive, so that the substrate is electrically insulated from the grounding boss by the spacer.

9. The plasma display apparatus as claimed in claim 1, wherein the grounding boss extends a first distance from the chassis,
   the substrate is spaced apart from the chassis by a second distance,
   the first distance is greater than the second distance, and
   the first distance is less than the height of the grounding bracket from the chassis.

10. The plasma display apparatus as claimed in claim 1, wherein:
   a through-hole part of the spacer is disposed in a space between the grounding boss and the grounding bracket.

11. The plasma display apparatus as claimed in claim 10, wherein:
   the grounding boss has a first end attached to the chassis,
   the grounding boss has a second end opposite to the first end, the second end being spaced apart from the grounding bracket by a first distance, and
   a height of the through-hole part of the spacer is less than or equal to the first distance.

12. The plasma display apparatus as claimed in claim 10, wherein:
   the through-hole part of the spacer is conductive, such that the through-hole part electrically connects the grounding boss to the grounding bracket.

* * * * *